United States Patent [19]

Joseph et al.

[11] 4,448,532

[45] May 15, 1984

[54] AUTOMATIC PHOTOMASK INSPECTION METHOD AND SYSTEM

[75] Inventors: David A. Joseph, Mountain View; Peter G. Eldredge, Santa Clara, both of Calif.

[73] Assignee: KLA Instruments Corporation, Santa Clara, Calif.

[21] Appl. No.: 249,474

[22] Filed: Mar. 31, 1981

[51] Int. Cl.³ ............................................. G01B 11/14
[52] U.S. Cl. .................................... 356/394; 356/237
[58] Field of Search ............... 356/390, 394, 398, 237; 371/69

[56] References Cited

U.S. PATENT DOCUMENTS

| | | | |
|---|---|---|---|
| 4,133,504 | 1/1979 | Dobler et al. | 371/69 |
| 4,247,203 | 1/1981 | Levy et al. | 356/398 |
| 4,347,001 | 8/1982 | Levy et al. | 356/398 |

OTHER PUBLICATIONS

Droege et al., "Hole Count Verifier", *IBM Technical Disclosure Bulletin*; vol. 2, No. 4, (Dec. 1959), pp. 98–100.

*Primary Examiner*—R. A. Rosenberger
*Attorney, Agent, or Firm*—Hamrick, Hoffman, Guillot & Kazubowski

[57] ABSTRACT

A method and apparatus for receiving two sets of digitized scan data from two optical detectors which simultaneously scan two supposedly identical portions of a photomask for comparing the two sets of scan data to detect defects, and for evaluating the defect data to determine whether or not it represents real defect information or false defect information. Scan lines containing defect data are scanned twice to produce two sets of defect data and the two sets are then compared to produce a real defect data set including only defects detected in both scans. False defects are thus eliminated from the final data set.

10 Claims, 20 Drawing Figures

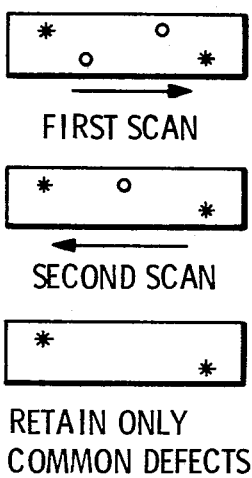
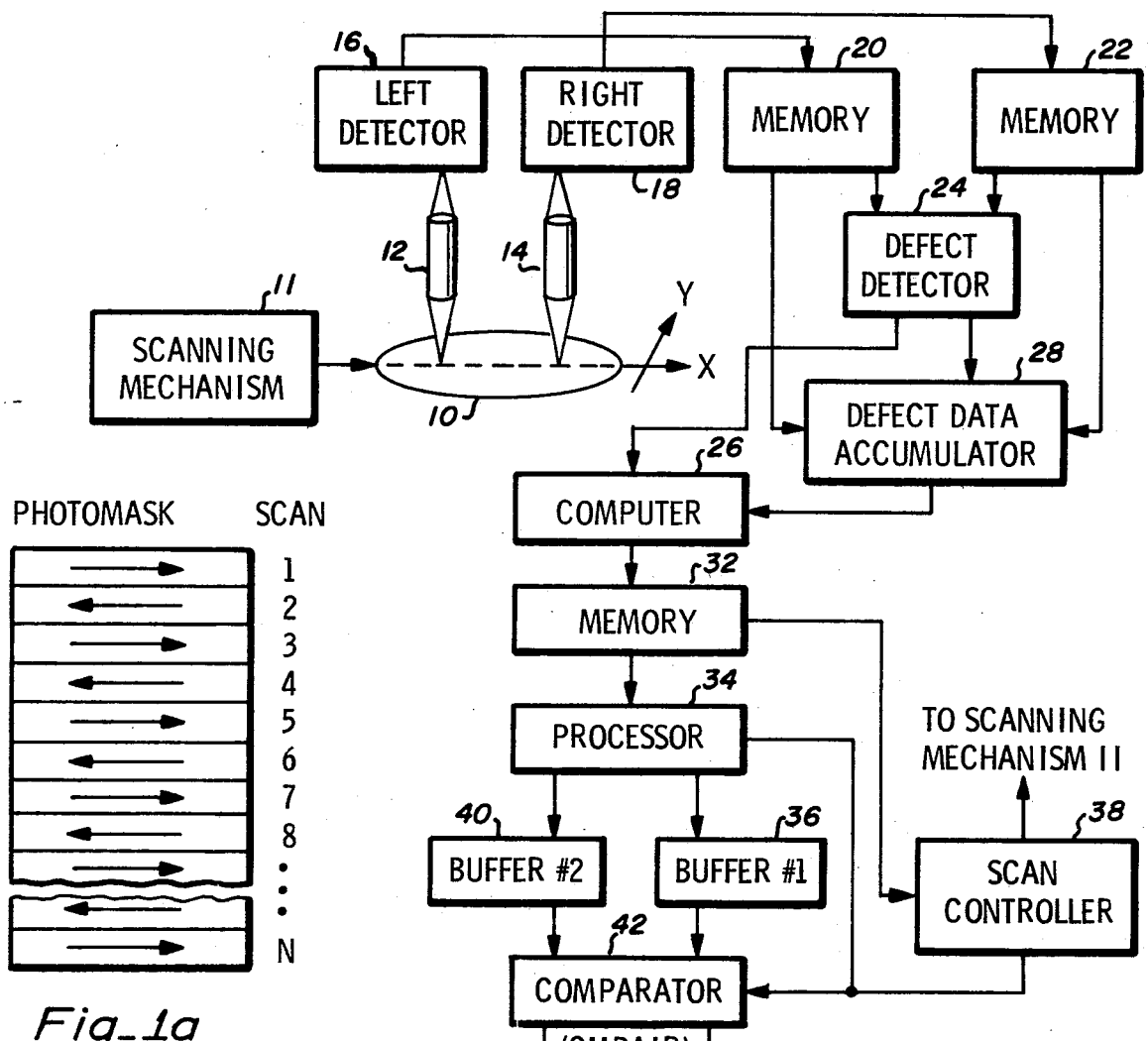
Fig_1a
Fig_1b
Fig_2

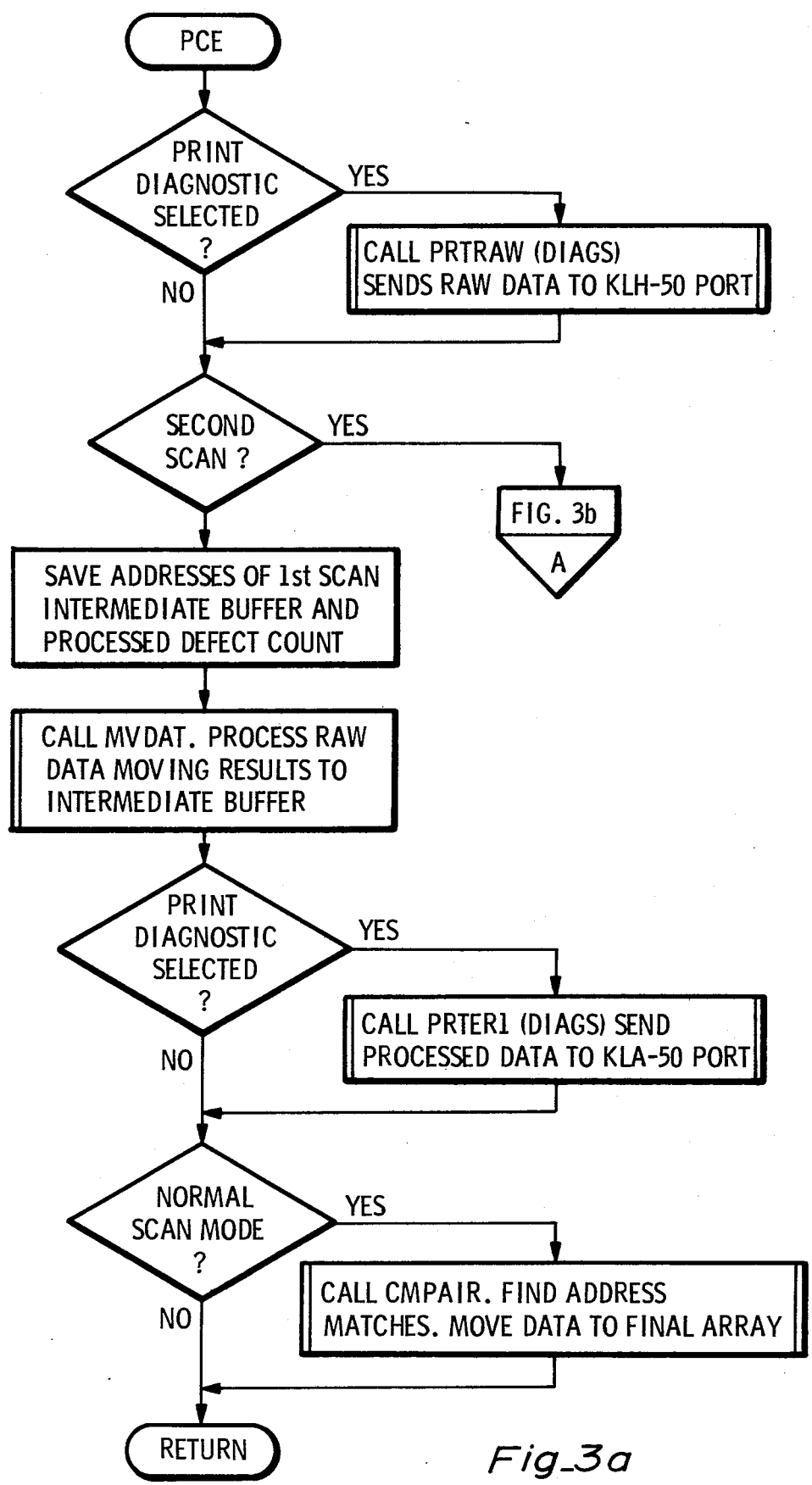
Fig_3a

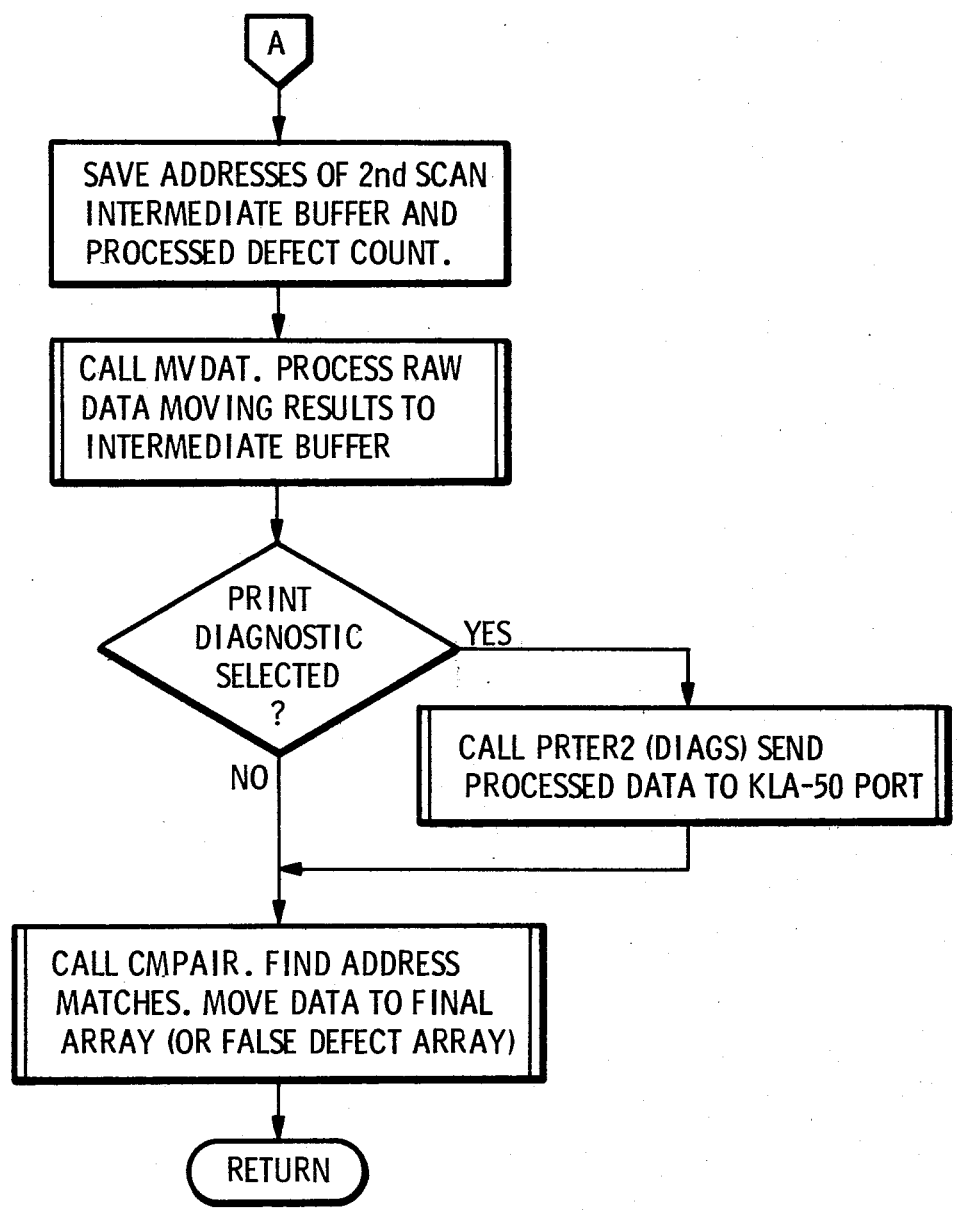
Fig_3b

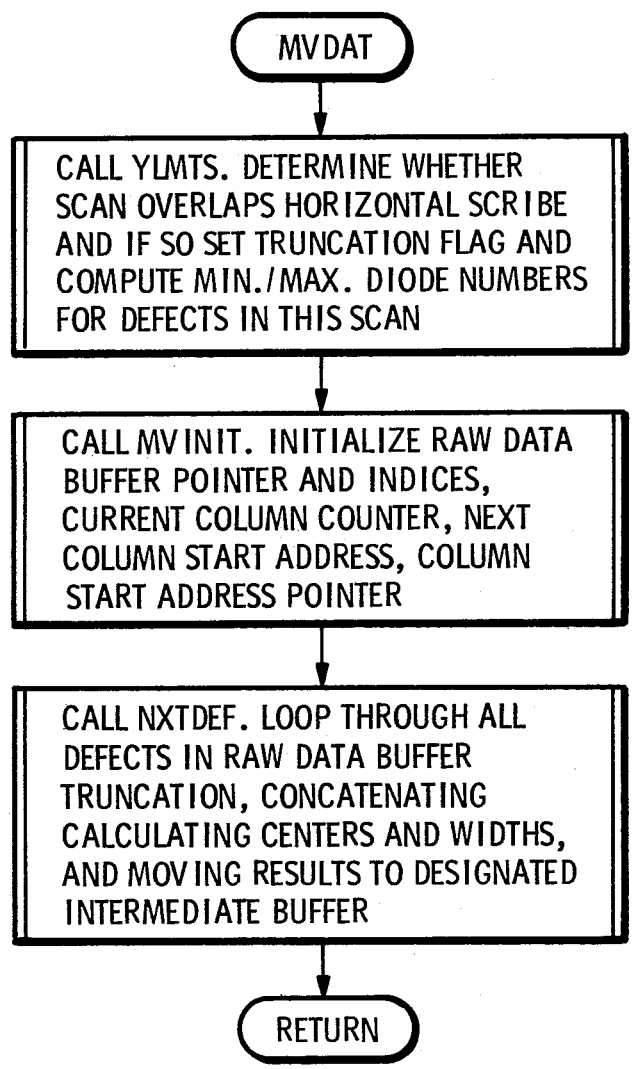
Fig_3c

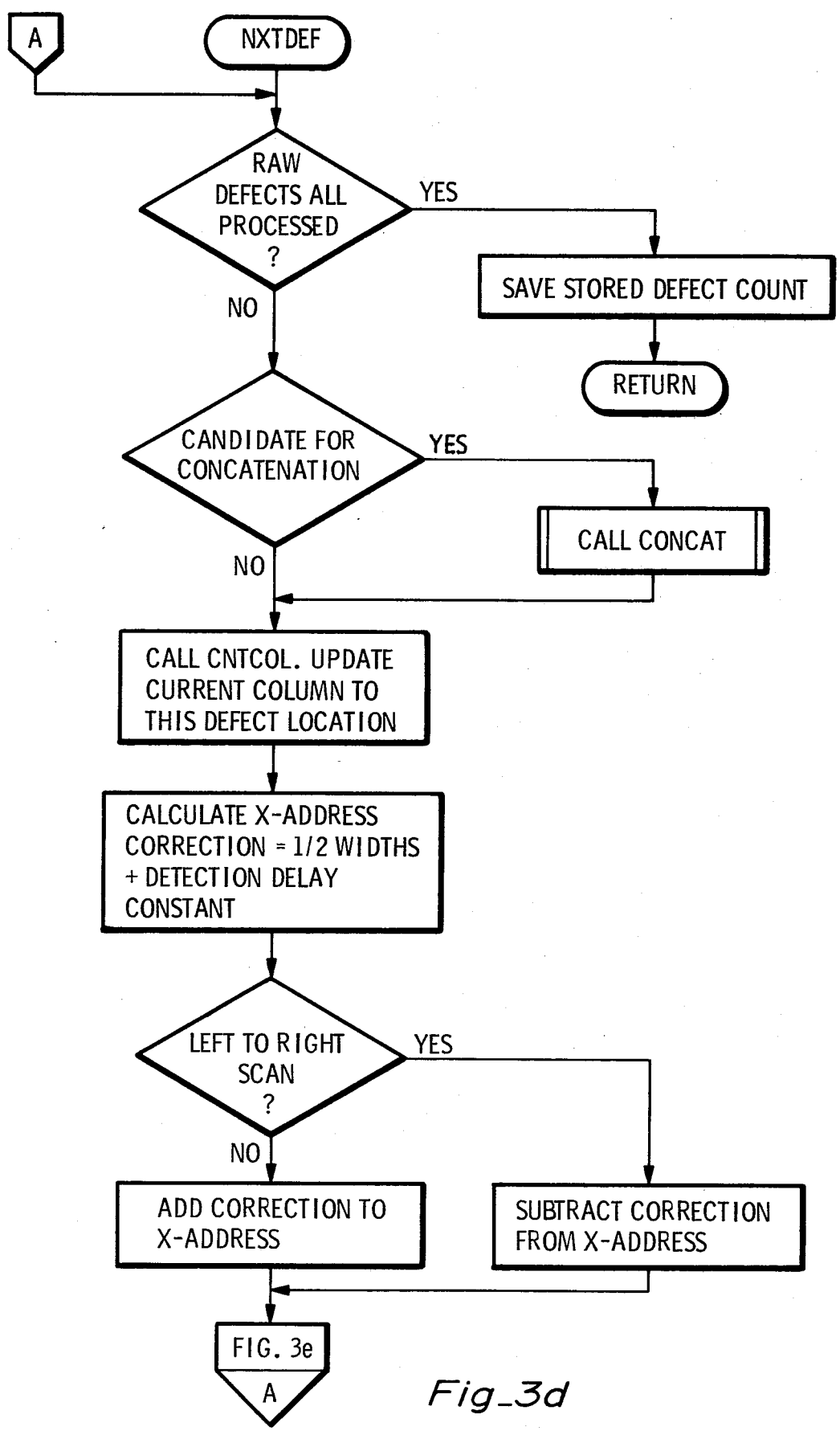
Fig_3d

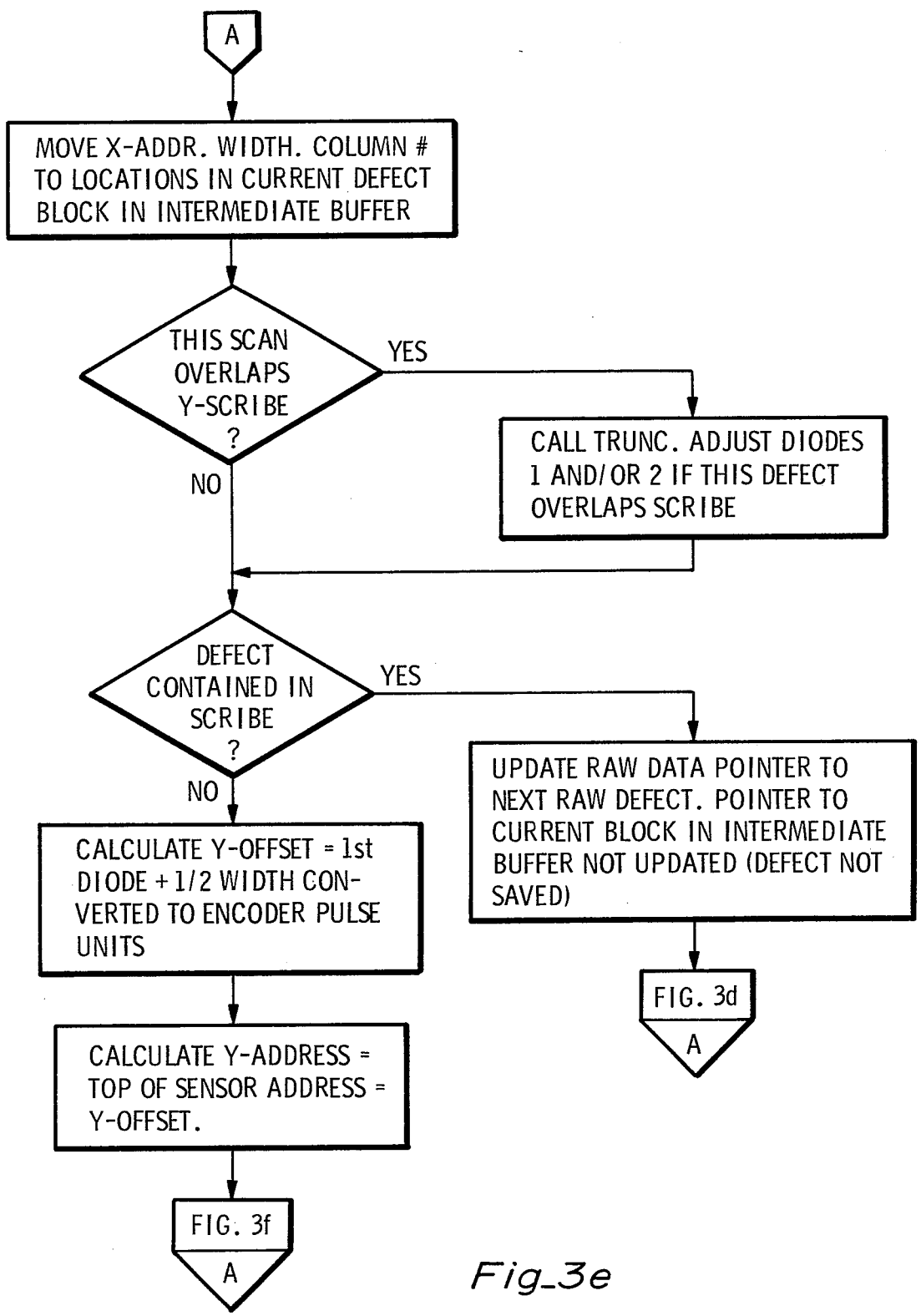
Fig_3e

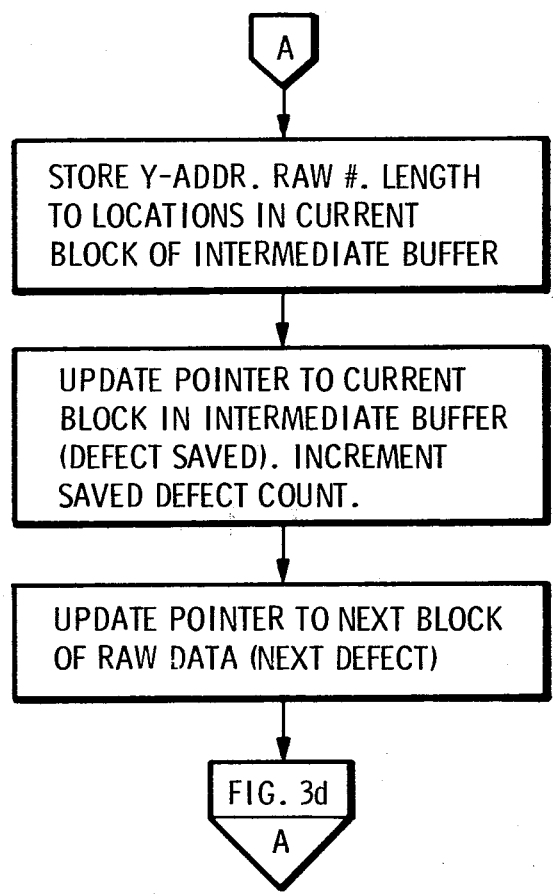
Fig_3f

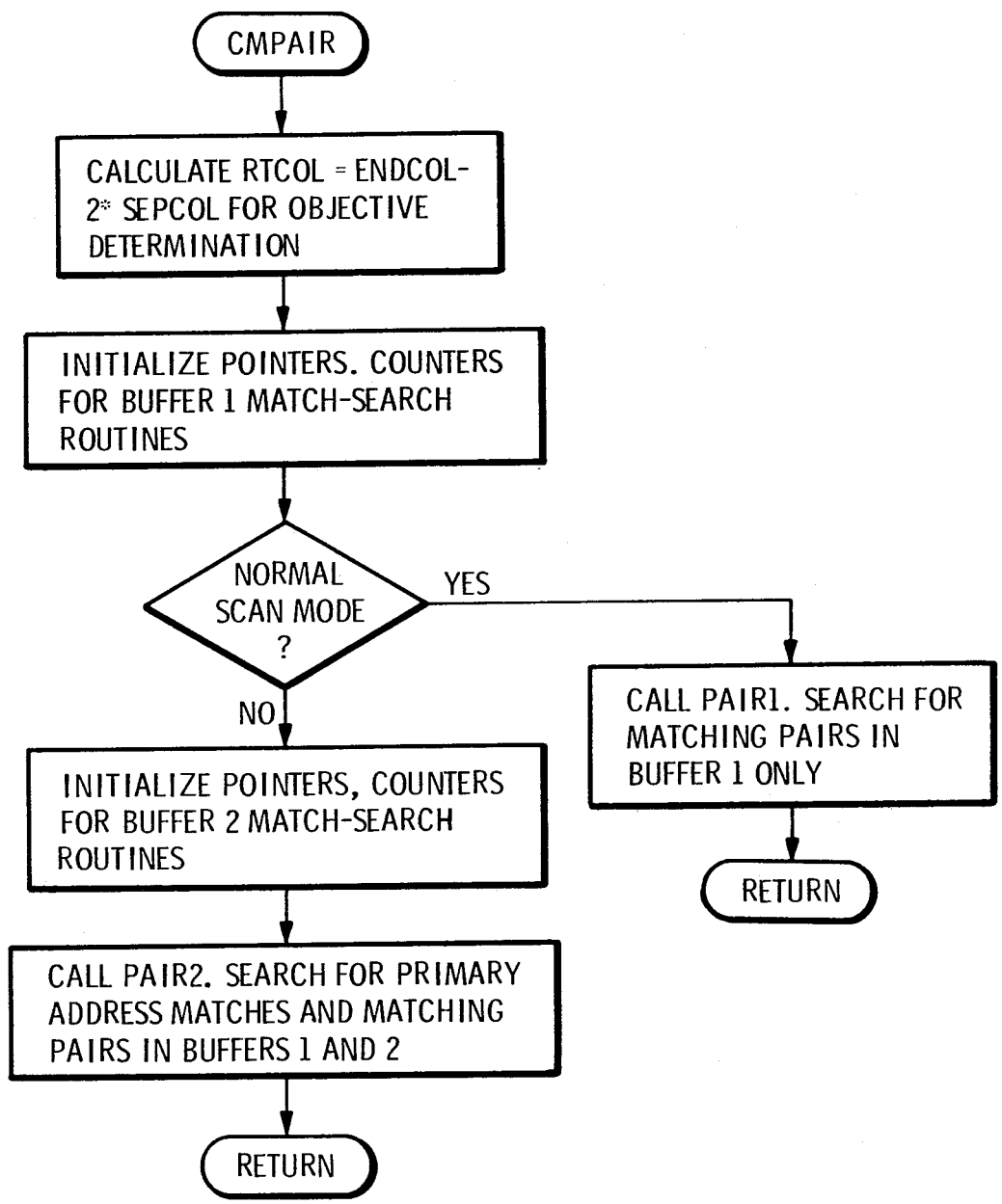
Fig_3g

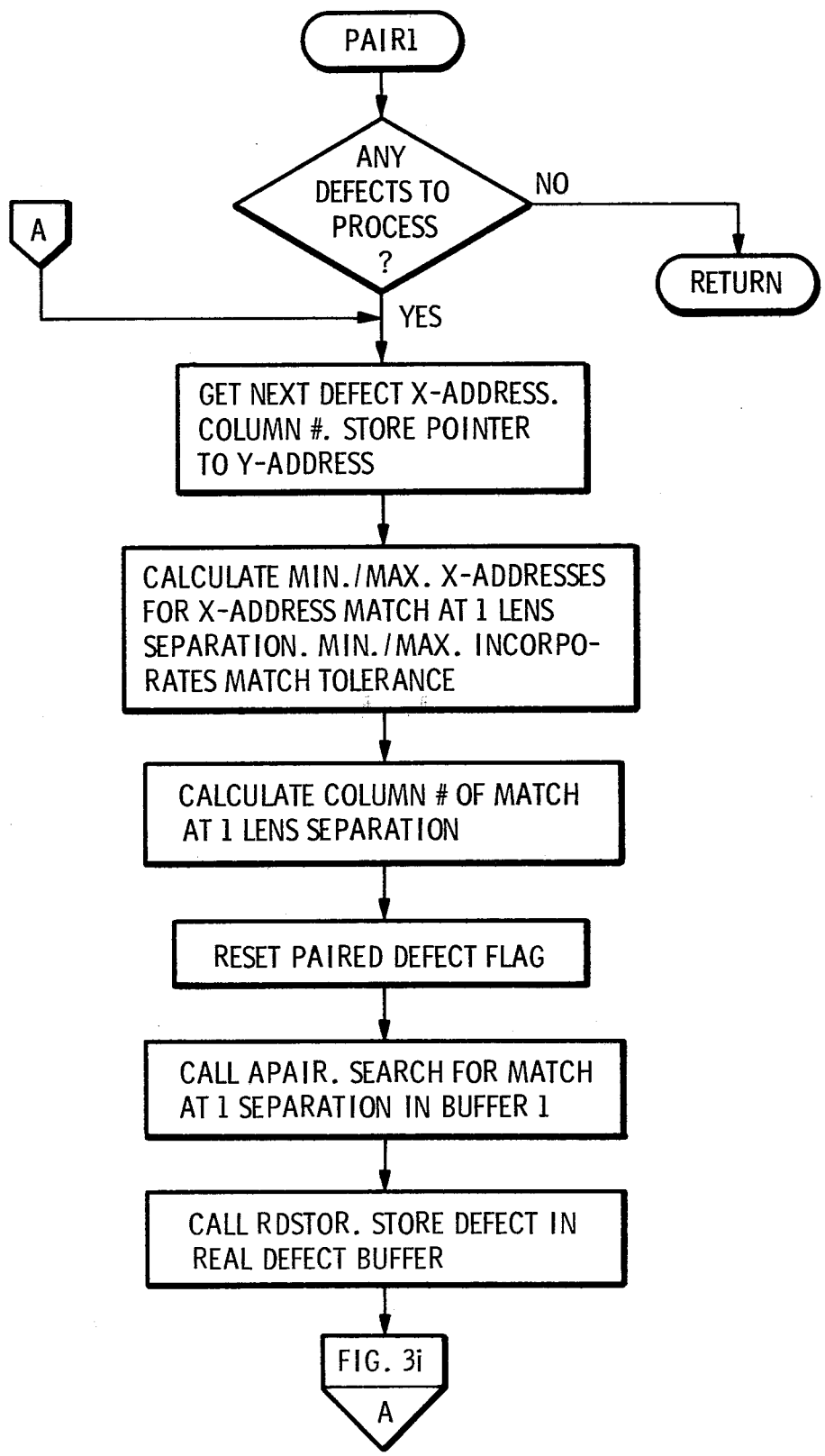
Fig_3h

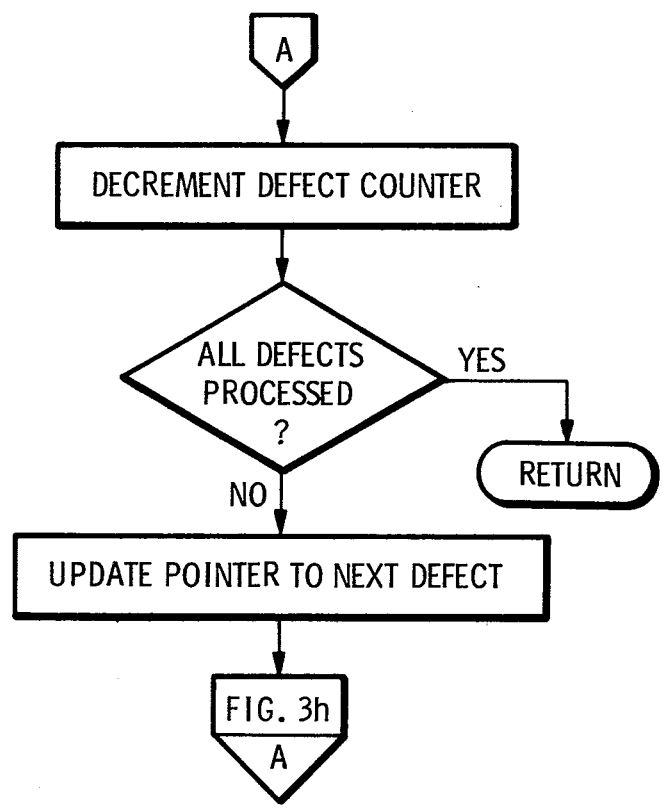
Fig_3i

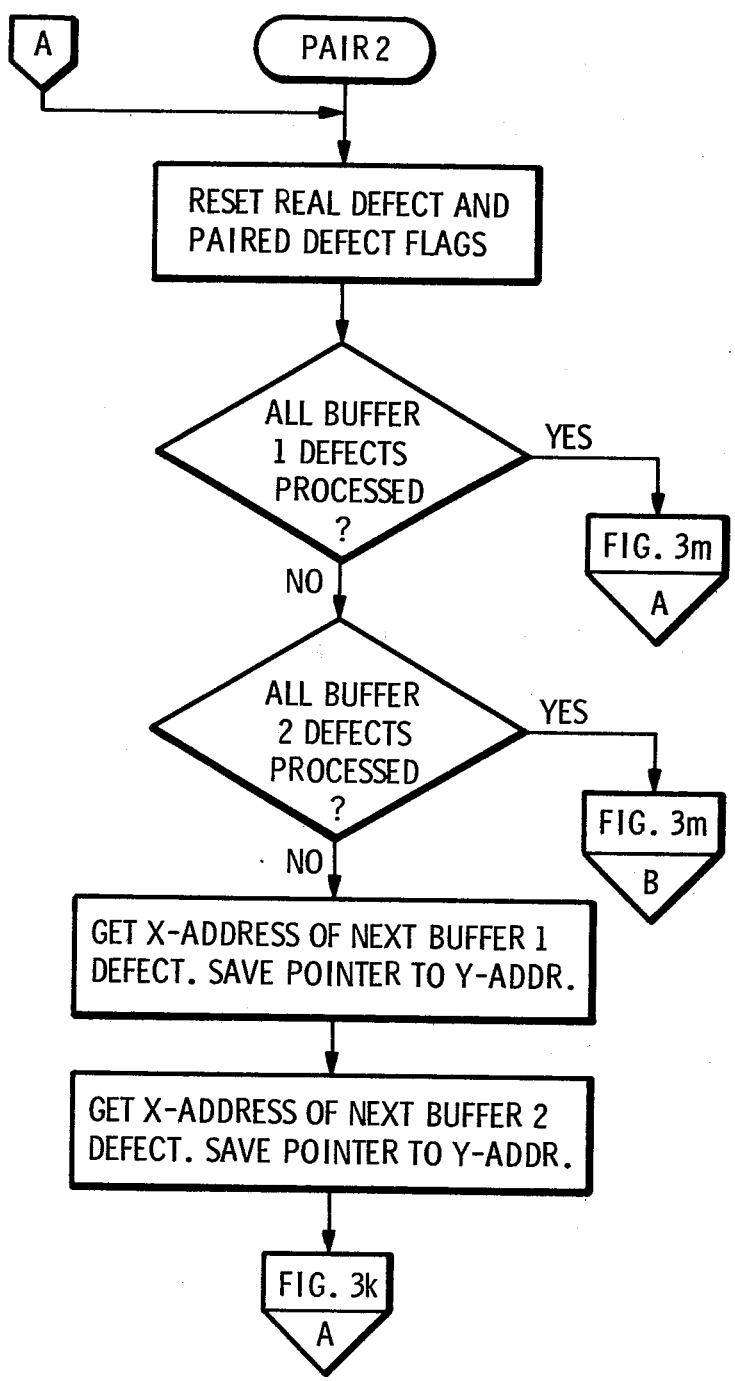
Fig_3j

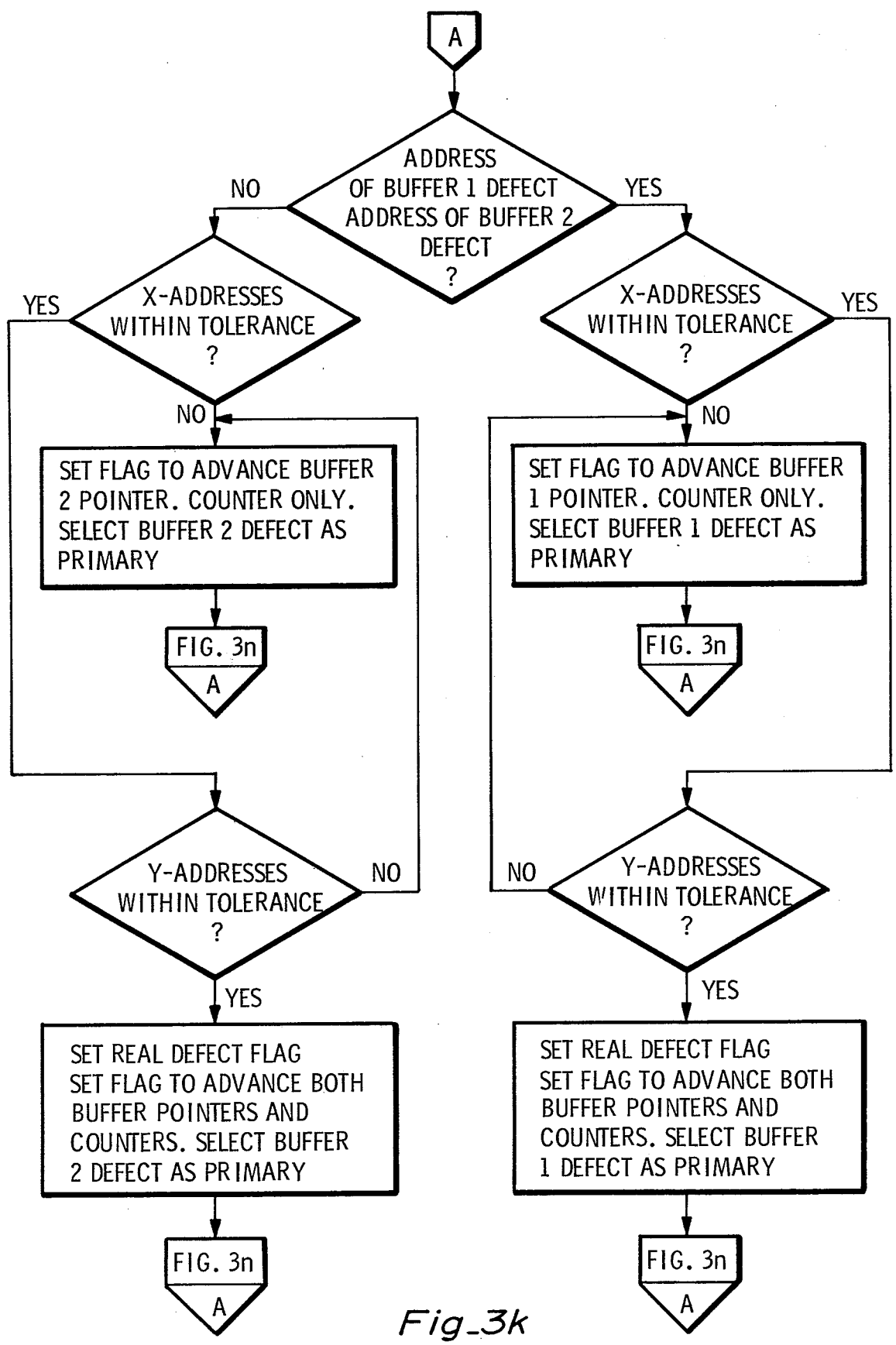
Fig_3k

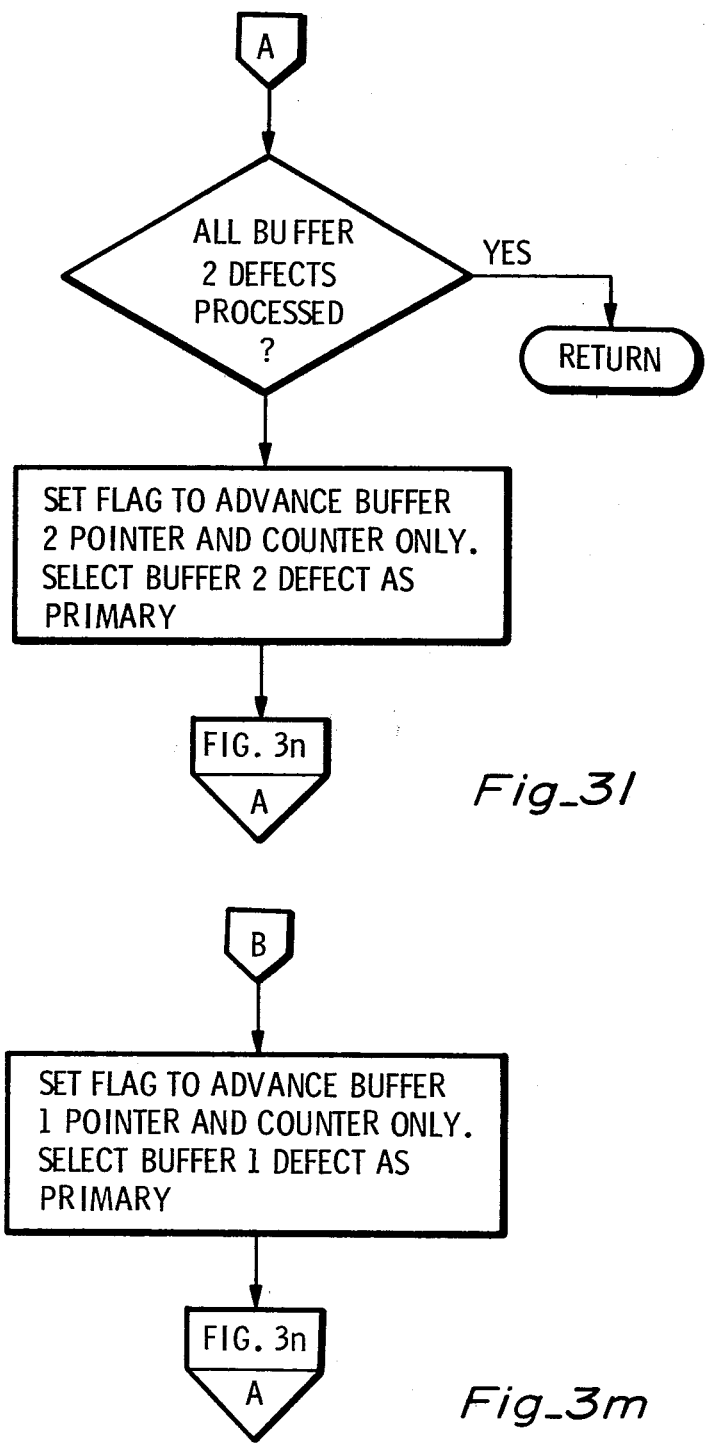

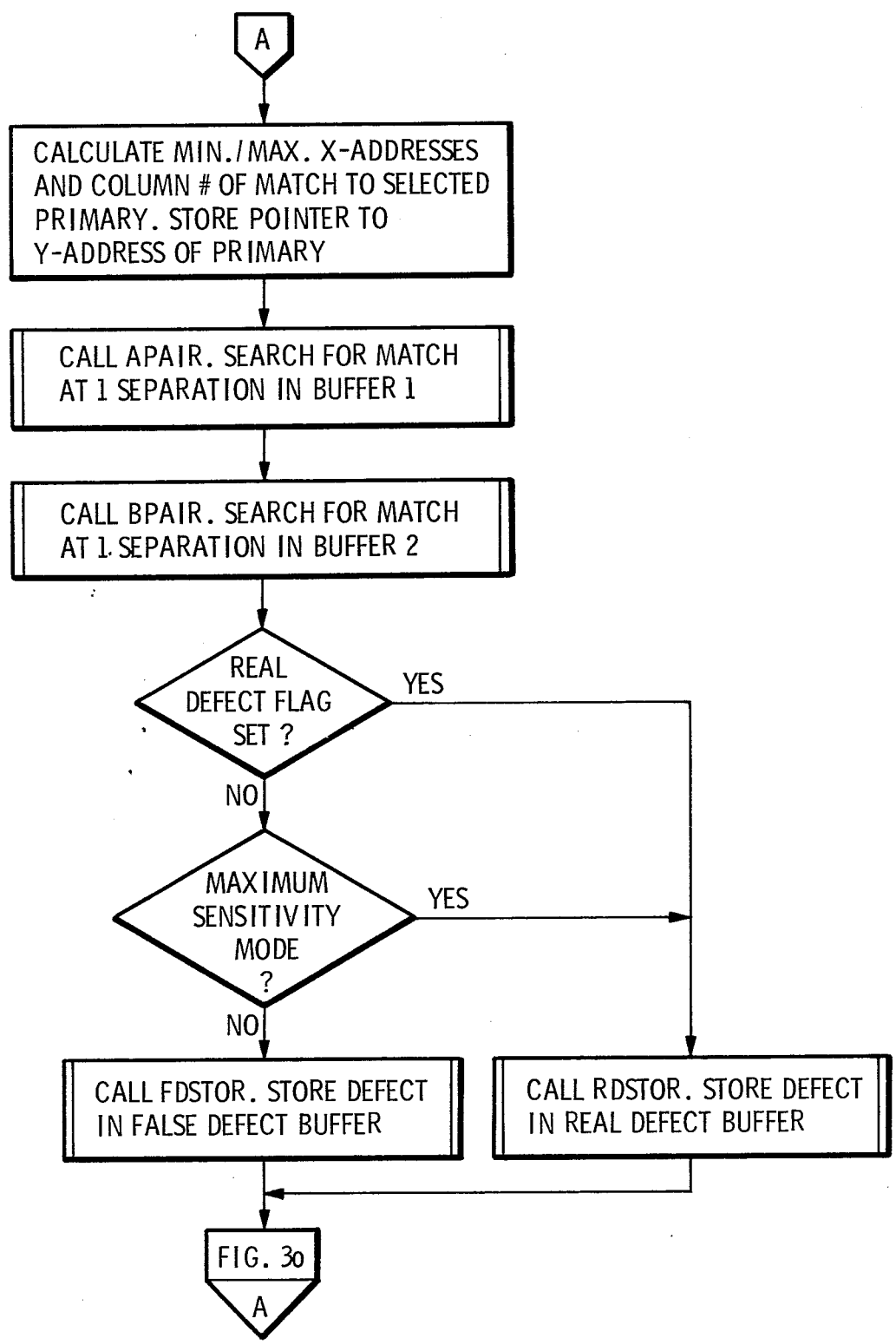
Fig_3n

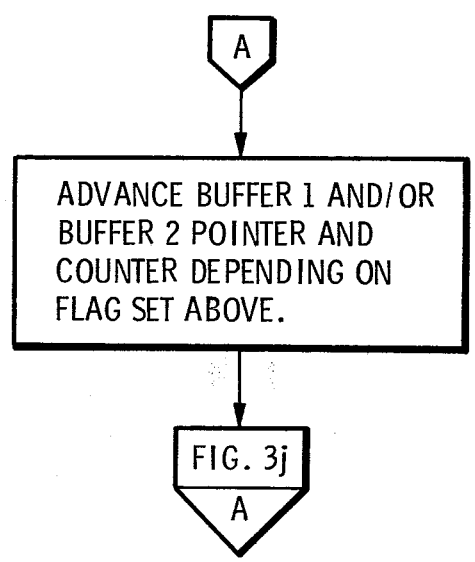
Fig_3o

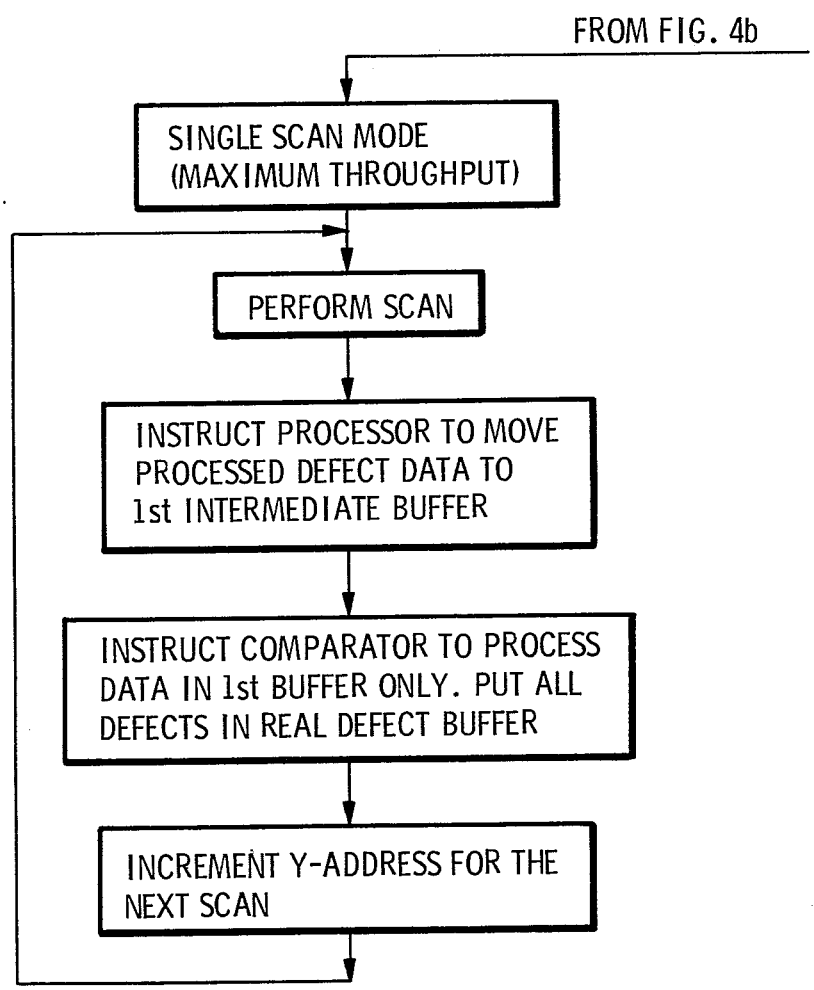
Fig_4a

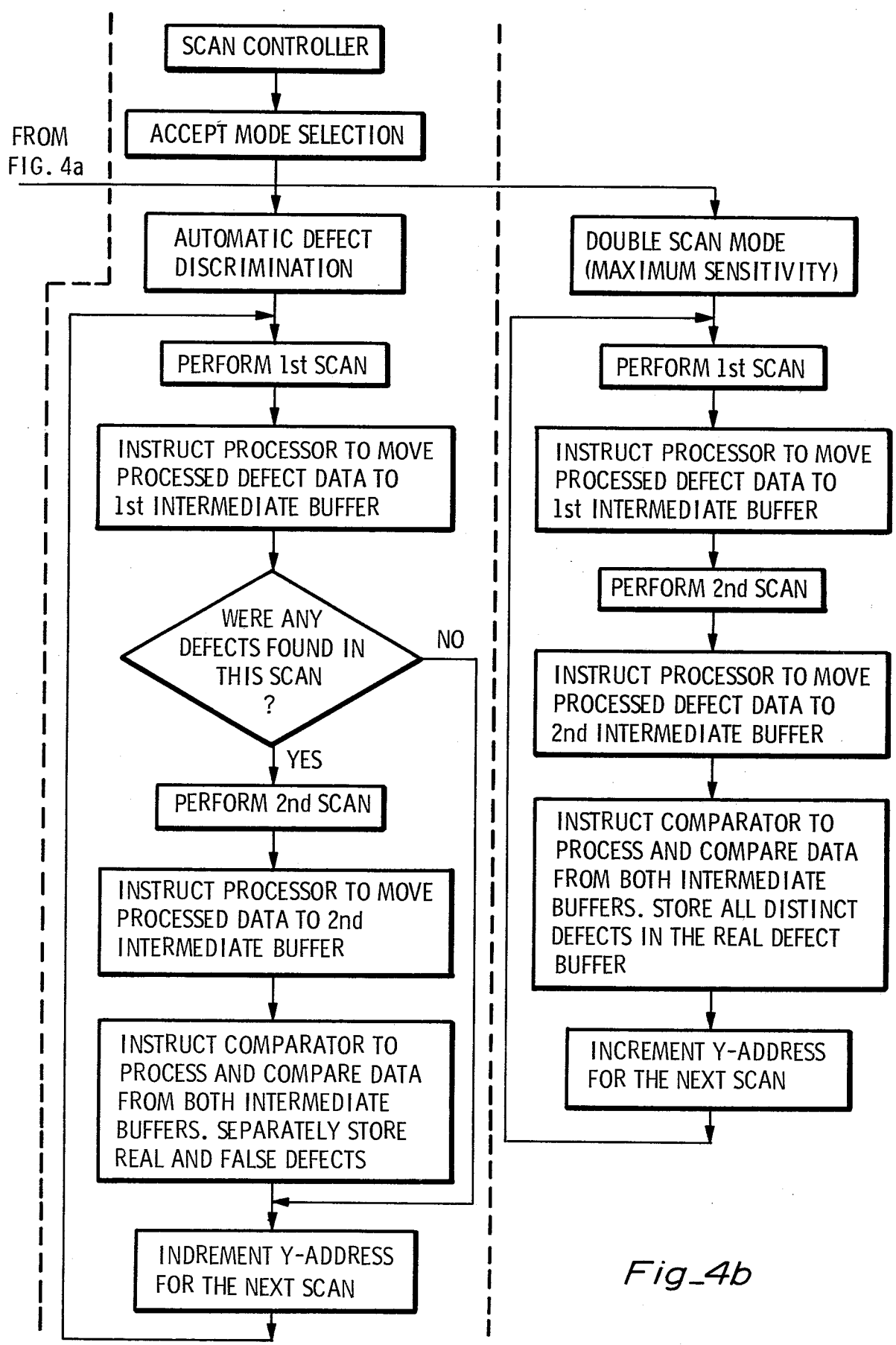
Fig_4b

AUTOMATIC PHOTOMASK INSPECTION METHOD AND SYSTEM

BACKGROUND OF THE PRESENT INVENTION

1. Field of the Invention

The present invention relates generally to object inspection apparatus and more particularly to an automatic photomask inspection method and system capable of locating extremely small defects in the transparencies of photomasks used to manufacture semiconductor devices while at the same time ignoring false defects generated by the processing electronics and/or hardware.

2. Description of the Prior Art

The subject matter of this application relates to an improvement to the automatic photomask inspection system disclosed in U.S. Pat. No. 4,247,203 and U.S. Pat. No. 4,347,001, both of which are assigned to the assigned of the present application. The entire disclosures of said patent and said patent application are hereby incorporated in full into this application and form a part of this disclosure.

In all prior art automatic photomask inspection systems, "false defects" materially affect the reliability of the inspection operation because the systems are incapable of distinguishing between real defects detected and "false defects" which appear in the system output as a result of certain types of photomask irregularities, system vibration, system optical inaccuracies, data handling errors, data storage irregularities, etc. As a consequence, inspection reliability is reduced and substantial time is lost in verifying the indicated defects so that they may be either ignored, counted or even corrected.

SUMMARY OF THE PRESENT INVENTION

It is therefore a primary objective of the present invention to provide an improved system for automatically handling the defect detection data, evaluating such data, and then classifying such data as either real defect or false defect data.

Briefly, the present invention relates to a method and apparatus for receiving to sets of digitized scan data from two optical detectors which simultaneously scan two supposedly identical portions of a photomask, for comparing the two sets of scan data to detect defects, and for evaluating the defect data to determine whether or not it represents real defect information or false defect information. In accordance with the present invention, scan lines containing defect data are scanned twice to produce two sets of defect data and the two sets are then compared to produce a real defect data set including only defects detected in both scans. False defects are thus eliminated from the final data set.

An important advantage of the present invention is that it eliminates false data from the system output and thus substantially increases the reliability of the system.

These and other objects and advantages of the present invention will no doubt become apparent to those skilled in the art after having read the following detailed description of a preferred embodiment thereof.

IN THE DRAWING

FIG. 1a is a diagram illustrating the manner in which a photomask is scanned;

FIG. 1b is a three-part diagram illustrating the dual scanning operation of the present invention;

FIG. 2 is a block diagram generally illustrating an automatic photomask inspection and data processing system in accordance with the invention;

FIGS. 3a–3o illustrate a flow chart demonstrating the operational sequence of the present invention; and FIGS. 4a and 4b illustrate a flow chart demonstrating the operational sequence of the scan controller shown in FIG. 2.

DETAILED DESCRIPTION OF THE PREFERRED EMBODIMENT

In the devices disclosed in the aforementioned patent and patent application, photomask defects are optically detected by simultaneously scanning two portions of a narrow strip (see FIG. 1a) of the same photomask which, if without defect, would be identical. Any differences between the two detections would then indicate that there was a possible defect on one of the mask portions. Although such a method provides a reliable technique for determining mask defects, it has been found that the detection system itself may generate spurious signals which show up in the output as defects when no actual defect is present.

These "false defects" may result from such things as slight differences in the geometries of the inspected mask portions, differences in focusing of the images onto the detectors, differences in illumination, vibrations of the system, intermittent memory bits and other similar problems.

Fortunately, however, such defects induced by these causes are probabilistic in nature and can be reduced in accordance with the present invention by rescanning each scan line if a defect is recorded, comparing the outputs thereof and discarding those detected defects which are not common to the two scans. If no defect is found on the first scan, then there is no reason to rescan the line. Such technique is illustrated in FIG. 1b of the drawing wherein a portion of the photomask is scanned in one direction and defects are recorded as illustrated by the asterisks (representing real defects) and circles (representing false defects). Thereafter, the same scan line is scanned in the reverse direction and the detected defects are likewise recorded. If these two sets of data are then compared and the nonmatching elements are discarded, only the common defects will be retained as real defects.

In order to implement such a detection scheme, a system such as that illustrated in FIG. 2 may be utilized. Although not illustrated in detail, the mechanical portions of the system scanning mechanism 11 are essentially the same as those illustrated in the aforementioned patent and patent application, and the present system may be embodied as either a complete system or as a subsystem of the apparatus disclosed therein. A photomask to be inspected is illustrated at 10 and is supported by appropriate carriage means forming a part of the scanning mechanism 11. As the optical detection heads 12 and 14 are in effect caused to move simultaneously along a scan line relative to the surface of a photomask 10, light from extremely small areas thereof is transmitted to left and right detectors 16 and 18 which digitize the scan results and transmit digitized information to memory banks 20 and 22.

As described in the aforementioned patent and patent application, the data stored in the memories 20 and 22 is then compared by a defect detector 24 and the output thereof, after suitable processing, is recorded as indicative of defects appearing at specified locations on the mask 10. In accordance with the present invention, the previously described signal processing operation is modified to include a computer 26 which receives, in addition to the output of detector 24, a signal from a defect data accumulator 28 and compiles data relative to the size of each detected defect and stores such raw data in a memory 32. A processor 34 then processes the raw data and stores the result in a first intermediate buffer 36.

Data stored within the memory 32 is monitored by a scan controller 38 which determines whether or not a second scan of the same line is to be made. Such determination is made if defects are found in the scan line. For example, if no defects are found, or alternatively, if less than a predetermined number of defects are found, no second scanning of the same line are necessary, and the scan controller 38 will signal the scanning mechanism to increment in the Y direction and scan the next line.

However, if one or more defects appear in the data stored in memory 32, controller 38 will cause mechanism 11 to reverse direction without incrementing in the Y direction and retrace the previous scan line. The output of the repeated scan will be processed by detectors 16 and 18 detected by detector 24, processed by computer 26 and then stored in memory 32 for subsequent processing by processor 34. However, the output of this processing operation will be stored in a second buffer 30.

A comparaor 42 then compares the data stored in the buffers 36 and 40, and if defects are detected at the same address locations on photomask 1, or are found at addresses which are different by one lens separation, such defects will be classified as real defects, and data corresponding thereto will be input to the real defect buffer 44. If on the other hand the defects stored in buffers 36 and 40 do not have matching addresses in the other buffer, such data will be classified as false defects and will be stored in false defect buffer 46.

The data stored in the buffers 44 and 46 can then be reviewed and processed by a suitable processor 48 and then be output to a printer 50, a disk storage mechanism and/or inspection controller 52 or a tape storage device 54. The data can also be output to a suitable statistical calculator 56 which can be used to calculate the inspection statistics.

Operation of the above-described system can be further understood by reference to the flow charts depicted in FIGS. 3a-3o in which the illustrated subroutines are identified by the bracketed abbreviations MVDAT, CMPAIR, RDSTOR, and FDSTOR appearing in FIG. 2. Operation of the scan controller 38 is depicted by the flow chart of FIG. 4.

Although the present invention has been described above in terms of an illustrative embodiment, it will be appreciated that modifications thereof will also be apparent to those skilled in the art. Moreover, by incorporating such a system into the previously described patented apparatus, the system can be caused to operate in various modes. For example, one mode might be a normal scan mode in which each swath (the area inspected in a single path across the mask) is scanned only once and all defects detected are processed in the normal fashion. In a maximum sensitivity mode, each swath would be scanned twice, producing two sets of defect data for each swath. The two sets would then be combined into a single set which includes defects detected in either or both of the scans with duplicates being eliminated. This mode would improve the probability of picking up all defects and hence increase sensitivity.

A third mode would be an automatic defect discrimination mode in which each swath is scanned once and if any defects are detected, a second scan is performed in the opposite direction in accordance with the above-described invention to produce a second data set for the scan line. The two sets would then be compared to produce a data set including only defects detected in both scans. Such mode could also be used to indicate that when a certain level of false defects are encountered, the machine needs servicing.

A fourth mode might be an adaptive mode in which the system would make a preliminary scan to determine whether or not an automatic defect discrimination mode was to be used.

Although the automatic defect discrimination mode is designed primarily for spurious (i.e., random) false defects, it may also be possible to use this mode to eliminate false defects stemming from certain fixed hardware malfunctions, most notable among these being a bad bit in one of the mask memories. This would normally cause a repeatable false defect which would not be discarded by the scheme discussed above, since it would appear in the same place on two successive scans. However, if the stage is moved in the Y direction before repeating a scan, the defects induced by the bad bit on the two scans have differing Y coordinates and hence will be discarded automatically by the above scheme.

Use of this technique might require a total of three scans to insure complete redundant coverage of the mask. One way of minimizing the number of extra scans is to store the diode numbers corresponding to each defect, and then, provided the totality of defects on the scan line do not span the entire diode array, drive the stage in Y only far enough to place all these defects on a different portion of the array before performing the redundant scan. By also retaining information (including diode numbers) of discarded defects it may also be possible to post-process this information to assist in localizing problems to memory location or diode number. In this way, false defects due to illumination nonuniformity might also be detected, with messages provided to the operator to schedule system adjustment or lamp replacement before the system is totally inoperable.

These and other alterations and modifications of the above-described system being recognized, it is intended that the appended claims be interpreted as covering all such alterations and modifications as fall within the true spirit and scope of the invention.

What is claimed is:

1. Optical inspection apparatus for detecting defects in photomasks and the like containing a plurality of supposedly identically configured portions. comprising:
   first and second detector means disposed in spaced-apart relationship and operative to simultaneously inspect corresponding sub-portions of two of said supposedly identically configured portions and to develop first and second digital signals corresponding to the detected character of each said sub-portion;
   scanning means for causing relative movement between the photomask and said first and second detector means thereby defining at least one scan line across the photomask being inspected;
   memory means for storing said first and second digital signals developed as said photomask is scanned;

defect detector means for comparing said stored first and second digital signals and for developing defect signals when said stored second signal differs from said stored first signal;

first signal processing means including first and second buffer means, said first processing means being operative to generate first and second address data corresponding to said stored first and second signals and to store in said first buffer means those defect signals and address data developed in response to a first scan of said one scan line, and operative to store in said second buffer means those defect signals and address data developed in response to a second scan of said one line;

comparator means for comparing the address data of defect signals contained in said first buffer means to the address data of defect signals stored in said second buffer means, and for generating real defect signals when defect signals stored in said first buffer means have a common address which defect signals stored in said second buffer means, and for generating false defect signals each time a defect signal stored in said first buffer means does not have a common address with a defect signal stored in said second buffer means;

real defect buffer means for receiving and storing said real defect signals;

false defect buffer means for receiving and storing said false defect signals; and utilization means for processing and storing or otherwise utilizing the data stored in said real defect buffer means and said false defect buffer means.

2. Optical inspection apparatus as recited in claim 1 and further comprising scan controller means for monitoring the defect signals stored in said memory means during the first scan of said one scan line and for causing said scanning means to repeat the scan of said one scan line if a predetermined number of defect signals are generated during the first scan of said one scan line.

3. Optical inspection apparatus as recited in claim 2 wherein said scanning means causes said first scan of said one scan line to be made in one direction and the second scan of said one scan line to be made in the opposite direction.

4. Optical inspection apparatus as recited in claims 1, 2 or 3 wherein said comparator means also generates real defect signals when the address data of a defect signal stored in said first buffer means is related to the address data of a defect signal stored in said second buffer means by a measure corresponding to the separation between said first and second detector means.

5. A process for detecting and locating defects in a photomask and for discriminating against false defects generated by the detection system, comprising:

making a first simultaneous inspection of a series of corresponding locations on two similarly configured areas of a photomask, said series of locations defining a scan line, and developing first and second digital signals corresponding to each inspection made along said scan line;

comparing said first and second signals and developing a first defect signal each time said first signal differs from said second signal;

generating first address data corresponding to the location on said scan line of each said first defect signal;

making a second simultaneous inspection of corresponding locations along said scan line and develping third and fourth digital signals corresponding to each second inspection made along said scan line;

comparing said third and fourth signals and developing a second defect signal each time said third defect signal differs from said fourth defect signal;

generating second address data corresponding to the location along said scan line of said said second defect signal;

comparing each of said first address signal to each said second address signal and developing a real defect signal each time coincidence is detected and developing a false defect signal each time a first address signal exists without a corresponding second address signal or vice versa.

6. A process as recited in claim 5 and further comprising developing a permanent record of said real defect signals and their corresponding address data.

7. A process as recited in claim 5 and further comprising developing a permanent record of said false defect signals and their corresponding address data.

8. A process as recited in claim 5 wherein said second inspection along said scan line is made in a direction opposite to that of said first inspection along said scan line.

9. A process as recited in claims 5 or 8 wherein said first and second inspections are made along a series of scan lines traversing the surface of said photomask.

10. A process as recited in claim 9 wherein the second said inspection of each said scan line is made only if a predetermined number of defect signals are developed during the first said inspection of the same scan line in such case any defect signals generated being classified as real defect signals.

* * * * *